United States Patent
Miyoshi et al.

(10) Patent No.: US 9,246,059 B2
(45) Date of Patent: Jan. 26, 2016

(54) LED ELEMENT, AND PRODUCTION METHOD THEREFOR

(71) Applicant: USHIO DENKI KABUSHIKI KAISHA, Tokyo (JP)

(72) Inventors: Kohei Miyoshi, Himeji (JP); Masashi Tsukihara, Himeji (JP)

(73) Assignee: USHIO DENKI KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/428,161

(22) PCT Filed: Sep. 5, 2013

(86) PCT No.: PCT/JP2013/073923
§ 371 (c)(1),
(2) Date: Mar. 13, 2015

(87) PCT Pub. No.: WO2014/045882
PCT Pub. Date: Mar. 27, 2014

(65) Prior Publication Data
US 2015/0263233 A1    Sep. 17, 2015

(30) Foreign Application Priority Data

Sep. 18, 2012   (JP) ................................ 2012-204923

(51) Int. Cl.
*H01L 29/24*   (2006.01)
*H01L 29/20*   (2006.01)
(Continued)

(52) U.S. Cl.
CPC ............ *H01L 33/32* (2013.01); *H01L 33/0075* (2013.01); *H01L 33/38* (2013.01);
(Continued)

(58) Field of Classification Search
CPC ....... H01L 33/007; H01L 33/02; H01L 33/25; H01L 33/26; H01L 33/42
USPC ........................ 257/76, 78, 103, 615, E25.032
See application file for complete search history.

(56) References Cited

U.S. PATENT DOCUMENTS 5,777,350 A    7/1998   Nakamura et al.
6,060,730 A    5/2000   Tsutsui
(Continued)

FOREIGN PATENT DOCUMENTS

JP    H11-31842 A    2/1999
JP    2976951 B2     9/1999
(Continued)

OTHER PUBLICATIONS

International Search Report; PCT/JP2013/073923; Oct. 1, 2013.
(Continued)

*Primary Examiner* — Nitin Parekh
(74) *Attorney, Agent, or Firm* — Studebaker & Brackett PC

(57) ABSTRACT

Provided is an LED element which achieves high light extraction efficiency even at low operating voltages and which can be produced using a simple process. The LED element has a first semiconductor layer made of a p-type nitride semiconductor, a light-emitting layer made of a nitride semiconductor formed on the upper layer of the first semiconductor layer, a second semiconductor layer made of an n-type nitride semiconductor formed on the upper layer of the light-emitting layer, and a transparent electrode formed on the whole surface of the second semiconductor layer. The second semiconductor layer in at least a region that is in contact with the transparent electrode is made of $Al_nGa_{1-n}N$ ($0<n<1$) and has an n-type impurity concentration larger than $1\times10^{19}/cm^3$.

1 Claim, 10 Drawing Sheets

(51) Int. Cl.
  *H01L 33/32* (2010.01)
  *H01L 33/38* (2010.01)
  *H01L 33/42* (2010.01)
  *H01L 33/00* (2010.01)
  *H01L 33/62* (2010.01)

(52) U.S. Cl.
  CPC .............. H01L 33/42 (2013.01); H01L 33/62 (2013.01); *H01L 2933/0016* (2013.01); *H01L 2933/0033* (2013.01); *H01L 2933/0066* (2013.01)

(56) References Cited

U.S. PATENT DOCUMENTS

| | | | |
|---|---|---|---|
| 6,744,071 B2 * | 6/2004 | Sano | B82Y 20/00 257/103 |
| 2001/0030318 A1 | 10/2001 | Nakamura et al. | |
| 2002/0167019 A1 | 11/2002 | Nakamura et al. | |
| 2003/0141506 A1 | 7/2003 | Sano et al. | |
| 2004/0104390 A1 | 6/2004 | Sano et al. | |
| 2005/0035364 A1 | 2/2005 | Sano et al. | |
| 2005/0211993 A1 | 9/2005 | Sano et al. | |
| 2007/0096076 A1 | 5/2007 | Sawada et al. | |
| 2009/0206361 A1 | 8/2009 | Miki et al. | |
| 2010/0025684 A1 * | 2/2010 | Shinohara | H01L 21/0237 257/49 |
| 2010/0065872 A1 | 3/2010 | Lee | |
| 2011/0095331 A1 * | 4/2011 | Hanawa | H01L 21/0242 257/99 |
| 2011/0254041 A1 | 10/2011 | Lee | |
| 2011/0284901 A1 * | 11/2011 | Kim | H01L 25/0756 257/98 |
| 2011/0316037 A1 * | 12/2011 | Kamei | H01L 33/42 257/99 |
| 2013/0119394 A1 * | 5/2013 | Zhu | H01L 29/872 257/76 |
| 2013/0126899 A1 | 5/2013 | Lee | |
| 2014/0008660 A1 * | 1/2014 | Jorgenson | H01L 21/0237 257/76 |

FOREIGN PATENT DOCUMENTS

| | | |
|---|---|---|
| JP | 3511970 B2 | 3/2004 |
| JP | 2007-103538 A | 4/2007 |
| JP | 2007-258529 A | 10/2007 |
| JP | 2008-034444 A | 2/2008 |
| JP | 2010-531058 A | 9/2010 |
| JP | 2012-151503 A | 8/2012 |
| WO | 03/065464 A1 | 8/2003 |

OTHER PUBLICATIONS

S. Fritze et al.; "High Si and Ge n-type doping of GaN doping—Limits and Impact on stress"; Applied Physics Letters, 100, 122104; 2012.

\* cited by examiner

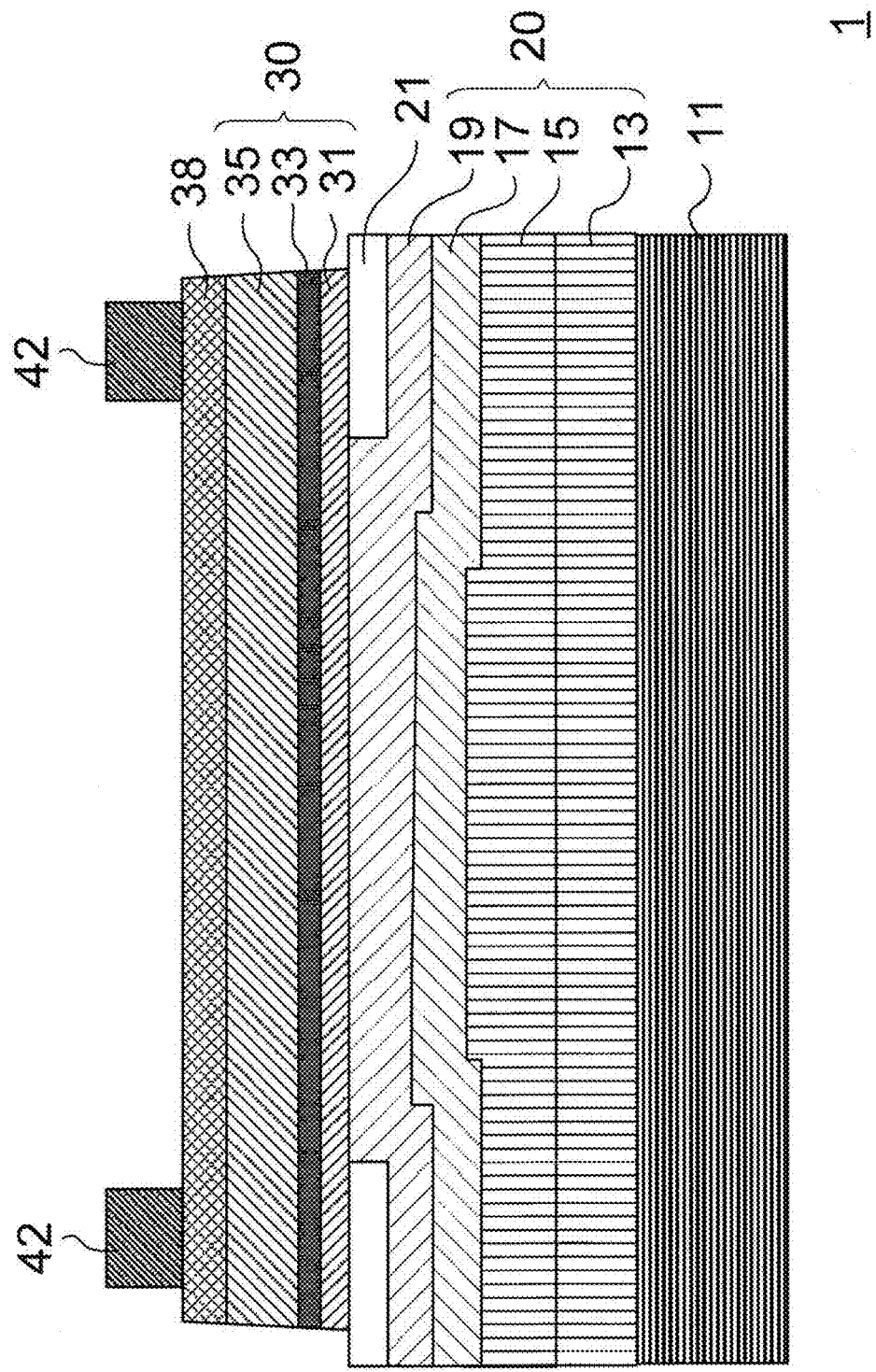

LED ELEMENT, AND PRODUCTION METHOD THEREFOR

TECHNICAL FIELD

The present invention relates to an LED element and a production method therefor, and more particularly to a longitudinal-type LED element made of a nitride semiconductor and a production method therefor.

BACKGROUND ART

Conventionally, in an LED made of a nitride semiconductor, GaN is mainly used. In this case, from the viewpoint of lattice matching, a GaN film having few defects is formed on a sapphire substrate by epitaxial growth, so as to form an LED element made of a nitride semiconductor. Here, the sapphire substrate is an insulating material, so that, for the purpose of supplying electric power to a GaN-based LED, the n-layer is exposed by cutting a part of the p-layer to form an electrode for power supply on each of the p-layer and the n-layer. The LED having a structure such that the electrodes for power supply are arranged in the same direction is referred to as a lateral-type structure, and such a technique is disclosed, for example, in the following Patent Document 1.

On the other hand, for the purpose of improving the light emission efficiency and achieving more efficient light extraction of the LED element, development of an LED having the so-called longitudinal-type structure in which the p-layer and the n-layer are arranged on the front and back surfaces to provide power supply is advanced. In producing an LED having this longitudinal-type structure, the n-layer and the p-layer are arranged on the sapphire substrate sequentially from below and, after a support substrate made of silicon (Si) or copper tungsten (CuW) is bonded to the p-layer side, the sapphire substrate is removed. In this case, the element surface will be the n-layer side, and the voltage supply is carried out by disposing a power supply terminal on this n-layer and connecting a wire, which is a power supply line, to this power supply terminal.

In the longitudinal-type structure, when a voltage is applied between an electrode on the p-layer side (hereafter referred to as "p-side electrode") and a bonding electrode formed on the n-layer (hereafter referred to as "n-side electrode"), a current flows from the p-side electrode to the n-side electrode via the LED layer including the light-emitting layer. By the flow of the current in the light-emitting layer, a region of the light-emitting layer emits light.

Here, the p-side electrode and the n-side electrode are arranged in a positional relationship of opposing each other in a vertical direction. For this reason, when a voltage is applied between the two electrodes, a current path in the vertical direction of travelling almost by the shortest distance from the p-side electrode towards the n-side electrode is formed. In this case, almost all of the current flows in a part of the light-emitting layer located vertically under the n-side electrode, and little current flows in other parts of the light-emitting layer, thereby causing a problem in that the light-emitting region is restricted to lower the light emission efficiency.

In view of such a problem, the following Patent Document 2 discloses a construction in which the n-side electrodes are disposed in a network configuration. By disposing the n-side electrodes in a network configuration, the current flowing in the light-emitting layer can be widened in a horizontal direction while ensuring the light extraction region.

Also, when the resistance value between the LED layer and the n-side electrode is high, another problem is caused such that the voltage needed for allowing the current needed for light emission to flow is high. For this reason, in order to extract light of a high light quantity with a low operating voltage, it is important that the resistance value between the LED layer and the n-side electrode is reduced as much as possible. In view of such a problem, the following Patent Document 3 discloses an LED element in which the n-layer in the LED layer is formed by sequential lamination of a high-concentration layer and a low-concentration layer.

PRIOR ART DOCUMENTS

Patent Documents

Patent Document 1: Specification of Japanese Patent No. 2976951
Patent Document 2: Specification of Japanese Patent No. 3511970
Patent Document 3: JP-A-2007-258529

Non-Patent Document

Non-patent Document 1: S. Fritze, et al., "High Si and Ge n-type doping of GaN doping—Limits and impact on stress", Applied Physics Letters 100, 122104, (2012)

SUMMARY OF THE INVENTION

Problems to be Solved by the Invention

If the n-side electrode can be formed on the whole surface of the n-layer in order to let the current flow in a wide range in the horizontal direction within the light-emitting layer, this can be said to be the most convenient method. However, a metal electrode is typically used as the n-side electrode. If the metal electrode is formed on the whole surface of the n-layer, the light emitted in the light-emitting layer is blocked by the metal electrode and cannot be extracted to the outside of the element. Therefore, in order to widen the light-emitting region in the horizontal direction as much as possible while ensuring the light extraction region, the above-described Patent Document 2 adopts a method of forming the metal electrodes in a network configuration.

However, even by this method, the metal electrodes formed in a network configuration block apart of the light coming from the light-emitting layer.

As a method of widening the light-emitting region in the horizontal direction as much as possible while extracting the light efficiently to the outside, there can be considered a method of forming the n-side electrode with a transparent electrode (light-permeable conductive layer) such as ITO on the whole surface of the n-layer. However, the transparent electrode has a larger specific resistance than a metal, and it is difficult to achieve an ohmic contact at the interface with the n-layer. As a result of this, a large resistance is generated between the n-layer and the n-side electrode, giving rise to a need of applying a large voltage between the p-side electrode and the n-side electrode in order to allow the current needed for light emission to flow to the light-emitting layer.

In order to let the needed current flow to the light-emitting layer while suppressing the applied voltage that is needed, it is preferable that the resistance value between the p-side electrode and the n-side electrode is reduced to be as much as possible. Therefore, in order to reduce the resistance value between the n-layer and the n-side electrode as much as possible while adopting a transparent electrode as the n-side electrode, there can be considered a method of achieving an ohmic contact between the n-layer and the n-side electrode by increasing the doping amount of the n-layer as much as possible.

In the meantime, a phenomenon is known in which, when the doping amount is increased to be $1\times10^{19}/cm^3$ or more in the semiconductor layer, particularly the n-layer, constituting the LED layer, film roughening is generated due to a cause such as deterioration of the state of atomic bond (see, for example, the above-described Non-patent Document 1). When such a phenomenon occurs, an n-layer having a low resistance is not formed, thereby resulting in decrease of the light emission efficiency. In order to overcome this problem, the above-described Patent Document 3 adopts a construction in which an n-layer having a high concentration and an n-layer having a low-concentration are alternately sequentially laminated. The document reports that, by adopting such a construction, the roughening of the surface formed in the high-concentration layer is buried by the low-concentration layer, so that a high-quality n-layer is formed.

However, when the method disclosed in Patent Document 3 is adopted, there is a need to alternately sequentially laminate plural sets of a high-concentration layer and a low-concentration layer as the n-layer, thereby causing another problem of making the process complex.

In view of the above-described problems, an object of the present invention is to achieve an LED element which achieves high light extraction efficiency even at low operating voltages and which can be produced using a simple process.

Means for Solving the Problems

The LED element of the present invention is an LED element containing a nitride semiconductor, and comprises:
a support substrate made of a conductor or a semiconductor; a conductive layer formed on the upper layer of the support substrate;
an insulating layer formed so that a bottom surface thereof is in contact with a portion of an upper surface of the conductive layer;
a first semiconductor layer made of a p-type nitride semiconductor formed so that a bottom surface thereof is in contact with a portion of the upper surface of the conductive layer and a portion of an upper surface of the insulating layer;
a light-emitting layer made of a nitride semiconductor formed on the upper layer of the first semiconductor layer;
a second semiconductor layer made of an n-type nitride semiconductor formed on the upper layer of the light-emitting layer;
a transparent electrode formed on the whole surface of the second semiconductor layer; and
a power supply terminal formed so that a bottom surface thereof is in contact with a portion of an upper surface of the transparent electrode, wherein
the second semiconductor layer in at least a region that is in contact with the transparent electrode is made of $Al_nGa_{1-n}N$ (0<n<1) and has an n-type impurity concentration larger than $1\times10^{19}/cm^3$.

From eager researches of the present inventors, it has been confirmed that, when the n-type second semiconductor layer is made of $Al_nGa_{1-n}N$ (0<n<1) instead of GaN, the problem of film roughening is not caused even when the impurity concentration is set to be larger than $1\times10^{19}/cm^3$. As a result of this, the resistance value of the n-layer can be reduced, so that an ohmic contact between the n-layer and the transparent electrode is achieved even when the transparent electrode is formed thereon.

Therefore, the transparent electrode can be formed on the whole surface of the second semiconductor layer. This allows that a current can be let to flow in a wide region of the light-emitting layer, whereby a wide light-emitting region is achieved. Also, since this is not a metal electrode, light is not blocked, so that high light extraction efficiency is achieved.

Further, it is sufficient that the second semiconductor layer is simply made of $Al_nGa_{1-n}N$ (0<n<1) having an impurity concentration larger than $1\times10^{19}/cm^3$, and there is no need to alternately laminate plural sets of a low-concentration layer and a high-concentration layer. Therefore, the LED element can be produced using a simple process without the need for a complicated production process.

Here, as the transparent electrode, ITO (Indium Tin Oxide), IZO (Indium Zinc Oxide), $In_2O_3$, $SnO_2$, or the like can be used, for example.

The LED element can be formed by passing through the following steps. In other words, the steps include:
a step (a) of preparing a sapphire substrate;
a step (b) of forming the second semiconductor layer made of $Al_nGa_{1-n}N$ (0<n<1) on the upper layer of the sapphire substrate;
a step (c) of forming the light-emitting layer and the first semiconductor layer on the upper layer of the second semiconductor layer in this order from below;
a step (d) of forming an insulating layer so as to cover a portion of an upper surface of the first semiconductor layer;
a step (e) of forming a conductive layer so as to cover an exposed portion of the upper surface of the first semiconductor layer and an upper surface of the insulating layer;
a step (f) of bonding a bottom surface of a support substrate made of a conductor or a semiconductor onto an upper surface of the conductive layer directly or via another conductive layer;
a step (g) of exfoliating the sapphire substrate by radiating laser light from above in a state in which the support substrate is positioned at a bottom and the sapphire substrate is positioned at a top, so as to expose an upper surface of the second semiconductor layer;
a step (h) of forming a transparent electrode on the upper layer of the second semiconductor layer so as to completely cover the upper surface of the second semiconductor layer; and
a step (i) of forming a power supply terminal at a predetermined site above the transparent electrode.

Further, the step (b) is provided as a step of forming the second semiconductor layer so that at least a region that is in contact with the sapphire substrate has an n-type impurity concentration larger than $1\times10^{19}/cm^3$.

Effect of the Invention

According to the present invention, an LED element which achieves high light extraction efficiency even at low operating voltages and which can be produced using a simple process can be achieved.

BRIEF DESCRIPTION OF THE DRAWINGS

FIG. 1 is a schematic sectional view of an LED element.

MODE FOR CARRYING OUT THE INVENTION

Figure 2A:
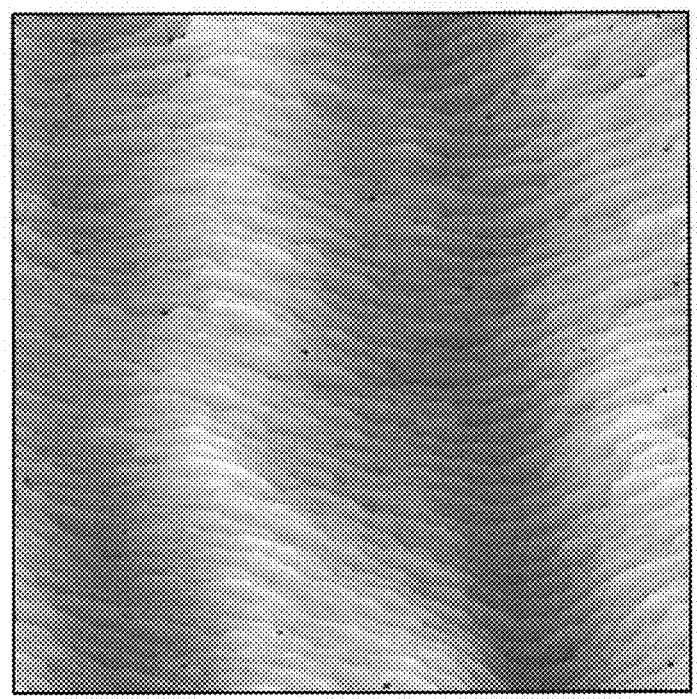
FIG. 2A is a photograph of the layer surface of AlGaN when the n-type impurity concentration is set to be $5\times10^{19}/cm^3$.

An LED element of the present invention and a production method therefor will be described with reference to the drawings. Here, in each drawing, the dimensional ratio of the drawings does not necessarily coincide with the actual dimensional ratio.

[Structure]

A structure of an LED element 1 of the present invention will be described with reference to FIG. 1. FIG. 1 is a schematic sectional view of the LED element 1.

The LED element 1 is constructed to include a support substrate 11, a conductive layer 20, an insulating layer 21, an LED layer 30, and a power supply terminal 42. The LED layer 30 is formed in such a manner that a p-type semiconductor layer 31 (corresponding to a "first semiconductor layer"), a light-emitting layer 33, and an n-type semiconductor layer 35 (corresponding to a "second semiconductor layer") are laminated in this order from below.

(Support Substrate 11)

The support substrate 11 is made of a conductive substrate such as CuW, W, or Mo, or a semiconductor substrate such as Si.

(Conductive Layer 20)

A conductive layer 20 made of a multi-layered structure is formed on the upper layer of the support substrate 11. In the present embodiment, this conductive layer 20 includes a solder layer 13, a solder layer 15, a protective layer 17, and a reflective electrode 19.

The solder layer 13 and the solder layer 15 are made, for example, of Au—Sn, Au—In, Au—Cu—Sn, Cu—Sn, Pd—Sn, Sn, or the like. As will be described later, these solder layer 13 and solder layer 15 are formed by bonding the two with each other after the solder layer 13 formed on the support substrate 11 and the solder layer 15 formed on another substrate are placed to face each other.

The protective layer 17 is made, for example, of a Pt-based metal (an alloy of Ti and Pt), W, Mo, Ni, or the like. As will be described later, in bonding via the solder layers, the protective layer 17 functions to prevent decrease in the light emission efficiency caused by diffusion of the material constituting the solder to the reflective electrode 19 side described later to decrease the reflectivity.

The reflective electrode 19 is made, for example, of an Ag-based metal (an alloy of Ni and Ag), Al, Rh, or the like. It is assumed in the LED element 1 that the light radiated from the light-emitting layer 33 of the LED layer 30 is extracted in the upward direction of FIG. 1, and the reflective electrode 19 functions to enhance the light emission efficiency by reflecting the light radiated downward from the light-emitting layer 33 in the upward direction.

Here, the conductive layer 20 is partially in contact with the LED layer 30, more particularly the p-type semiconductor layer 31 and, when a voltage is applied between the support substrate 11 and the power supply terminal 42, a current path in which the current flows to the power supply terminal 42 via the support substrate 11, the conductive layer 20, and the LED layer 30 is formed.

(Insulating Layer 21)

The insulating layer 21 is made, for example, of $SiO_2$, SiN, $Zr_2O_3$, AlN, $Al_2O_3$, or the like. This insulating layer 21 is formed so that an upper surface thereof is in contact with a bottom surface of the p-type semiconductor layer 31. Here, this insulating layer 21 functions as an etching stopper layer at the time of element separation, as will be described later.

(LED Layer 30)

As described above, the LED layer 30 is formed in such a manner that the p-type semiconductor layer 31, the light-emitting layer 33, and the n-type semiconductor layer 35 are laminated in this order from below.

The p-type semiconductor layer 31 is, for example, made of a multi-layered structure including a layer (hole supply layer) made of $Al_mGa_{1-m}N$ (0<m<1) and a layer (protective layer) made of GaN. Each of the layers is doped with a p-type impurity such as Mg, Be, Zn, or C.

The light-emitting layer 33 is made, for example, of a semiconductor layer having a multiquantum well structure formed by repetition of a well layer made of GaInN and a barrier layer made of AlGaN. These layers may be either non-doped or doped to be p-type or n-type.

The n-type semiconductor layer 35 has a multi-layered structure including a layer (protective layer) made of GaN in a region that is in contact with the light-emitting layer 33 and a layer (electron supply layer) made of $Al_nGa_{1-n}N$ (0<n<1) in a region that is in contact with the transparent electrode 38. At least the protective layer is doped with an n-type impurity such as Si, Ge, S, Se, Sn, or Te and, in particular, is preferably doped with Si.

The n-type semiconductor layer 35 in the region that is in contact with the transparent electrode 38 is doped with an impurity so that the n-type impurity concentration is larger than $1\times10^{19}/cm^3$, preferably $3\times10^{19}/cm^3$ or more. Here, as will be described later on the basis of the photographs obtained by experiments, film roughening is not generated in the present construction even when the impurity concentration of the n-type semiconductor layer 35 is set to have a value larger than $1\times10^{19}$/cm$^3$ (for example, $5\times10^{19}$/cm$^3$).
(Transparent Electrode 38)

The transparent electrode 38 is made of a light-permeable conductive material such as ITO, IZO, In$_2$O$_3$, SnO$_2$, or IGZO (InGaZnOx). This transparent electrode 38 is formed on the whole surface of the n-type semiconductor layer 35 and achieves widening of current in the horizontal direction of the light-emitting layer 33.

Here, as will be described later with reference to experimental data, in the present construction, an ohmic connection is formed at the interface between the n-type semiconductor layer 35 and the transparent electrode 38, thereby achieving reduction of resistance between the n-type semiconductor layer 35 and the transparent electrode 38.
(Power Supply Terminal 42)

The power supply terminal 42 is formed on the upper layer of the transparent electrode 38 and is formed, for example, of Cr—Au. To this power supply terminal 42, a wire formed, for example, of Au, Cu, or the like is connected (not illustrated in the drawings), and the other end of this wire is connected to a power supply pattern of a substrate on which the LED element 1 is disposed (not illustrated in the drawings).

Here, although not illustrated in the drawings, an insulating layer serving as a protective film may be formed on the side surface and on the upper surface of the LED layer 30 and the transparent electrode 38. Here, the insulating layer serving as the protective film is preferably made of a material having light permeability (for example, SiO$_2$ or the like). Also, in the above-described embodiment, one material constituting the p-type semiconductor layer 31 has been described as Al$_m$Ga$_{1-m}$N (0<m<1), and one material constituting the n-type semiconductor layer 35 has been described as Al$_n$Ga$_{1-n}$N (0<n<1); however, these may be the same material.
[Validation of Presence or Absence of Film Roughening]

Next, the fact that the film roughening is not generated even when the impurity concentration is increased to be larger than $1\times10^{19}$/cm$^3$ by constructing the n-type semiconductor layer 35 with Al$_n$Ga$_{1-n}$N (0<n<1) as in the LED element 1 will be described with reference to the experimental data of FIGS. 2A and 2B. Here, in the following, Al$_n$Ga$_{1-n}$N (0<n<1) is abbreviated as Al$_n$Ga$_{1-n}$N.

FIG. 2A is a photograph of a layer surface of AlGaN when the n-type impurity concentration is set to be $5\times10^{19}$/cm$^3$. Also, FIG. 2B is a photograph of a layer surface of GaN when the n-type impurity concentration is set to be $1.5\times10^{19}$/cm$^3$. Here, FIG. 2A shows an image captured by an AFM (Atomic Force Microscopy), and FIG. 2B shows an image captured by an SEM (Scanning Electron Microscope).

Figure 2B:
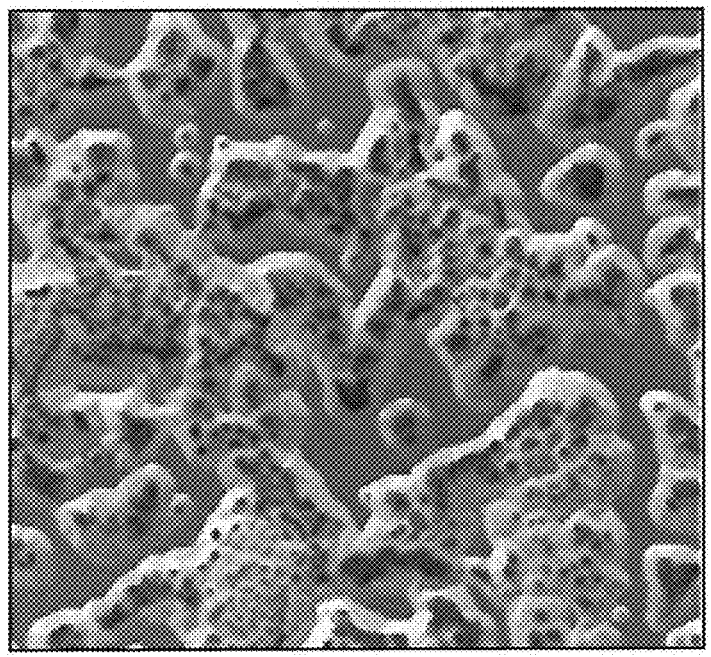
FIG. 2B is a photograph of the layer surface of GaN when the n-type impurity concentration is set to be $1.5\times10^{19}/cm^3$.

As shown in FIG. 2B, it will be understood that, when the n-type semiconductor layer is made of GaN, roughening is generated on the surface when the n-type impurity concentration is set to be $1.5\times10^{19}$/cm$^3$. Here, roughening on the surface was also confirmed in a similar manner when the impurity concentration was set to be $1.3\times10^{19}$/cm$^3$ or $2\times10^{19}$/cm$^3$. From this, it will be understood that roughening is generated on the layer surface when the impurity concentration is increased to be larger than $1\times10^{19}$/cm$^3$ as disclosed in Non-patent Document 1.

In contrast, according to FIG. 2A, it will be understood that, when the n-type semiconductor layer is made of AlGaN, a step-like surface (atomic step) is confirmed and roughening is not generated on the layer surface even when the n-type impurity concentration is set to be $5\times10^{19}$/cm$^3$. Here, it has been confirmed in a similar manner that roughening is not generated on the layer surface even when the component ratio between Al and Ga is changed (Al$_n$Ga$_{1-n}$N) as a constituent material. Also, a photograph similar to that of FIG. 2A was obtained when the n-type semiconductor layer was made of GaN and the n-type impurity concentration was set to be $0.5\times10^{19}$/cm$^3$, that is, when the n-type impurity concentration was set to be $1\times10^{19}$/cm$^3$ or less.

According to the above, it will be understood that, by constructing the n-type semiconductor layer with Al$_n$Ga$_{1-n}$N, the problem of film roughening is not caused even when the n-type impurity concentration is increased to be larger than $1\times10^{19}$/cm$^3$.
[Validation of Ohmic Connection]

Next, the fact that an ohmic connection is formed between the n-type semiconductor layer 35 and the transparent electrode 38 when the n-type semiconductor layer 35 in at least a region that is in contact with the transparent electrode 38 is made of Al$_n$Ga$_{1-n}$N having an impurity concentration larger than $1\times10^{19}$/cm$^3$ will be described with reference to Examples.

Figure 3A:
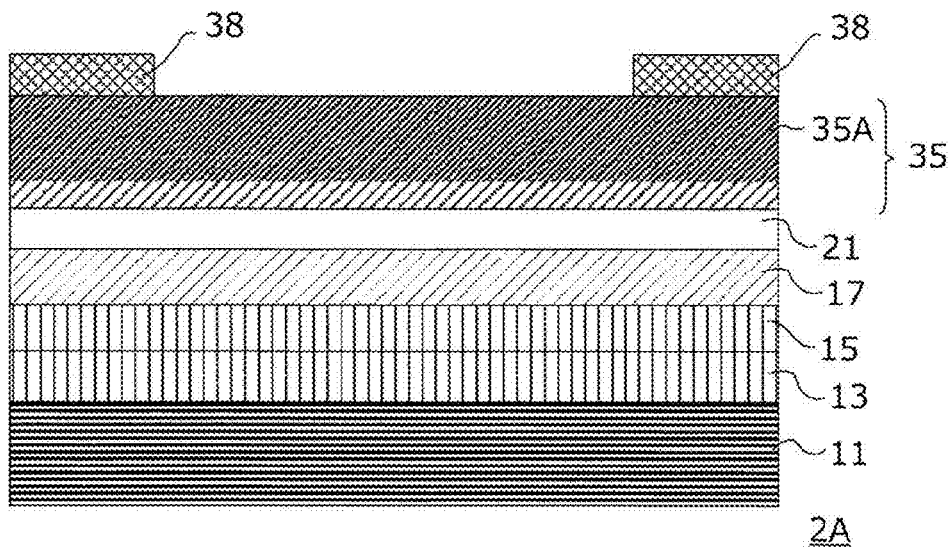
FIG. 3A is a construction view of an element for validation of ohmic contact (Example 1).
Figure 3B:
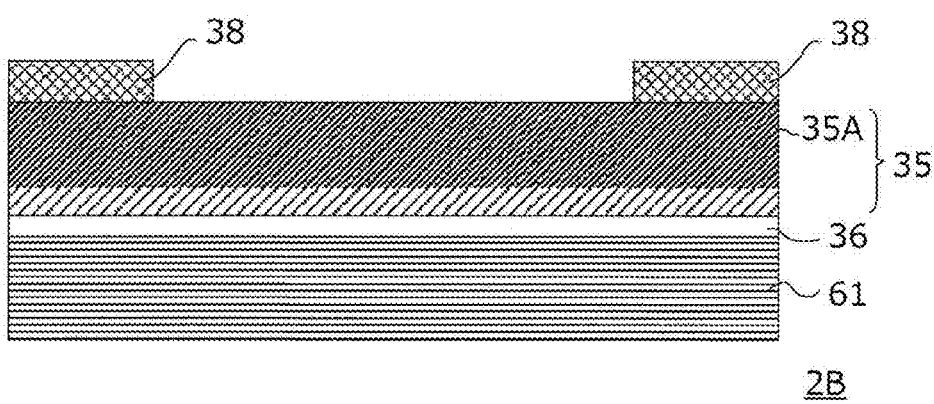
FIG. 3B is a construction view of an element for validation of ohmic contact (Example 2).
Figure 3C:
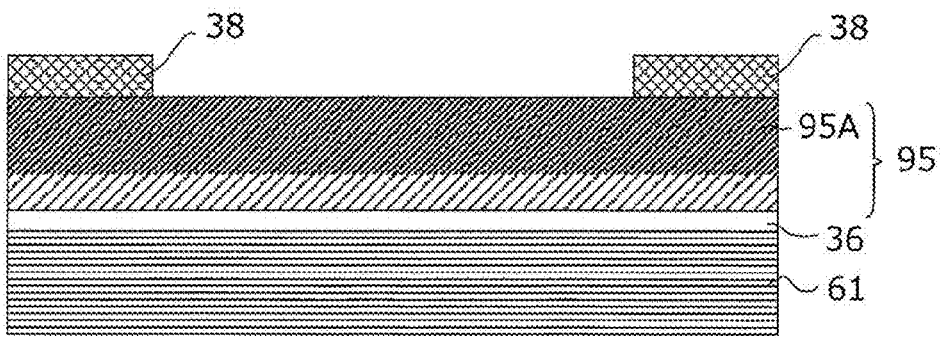
FIG. 3C is a construction view of an element for validation of ohmic contact (Comparative Example).

FIGS. 3A to 3C show examples of elements formed for validation of ohmic connection. Here, the elements shown in FIGS. 3A to 3C are merely for validation of ohmic connection between the n-type semiconductor layer 35 and the transparent electrode 38, so that, unlike the LED element 1, the elements were constructed to the extent necessary for validation. Also, in FIGS. 3A to 3C, ITO was adopted as the transparent electrode 38.

Example 1

In the element 2A for validation shown in FIG. 3A, solder layers 13, 15 and a protective layer 17 for preventing diffusion of solder are formed on a support substrate 11 similarly to the LED element 1. Further, an n-type semiconductor layer 35 is formed above the protective layer 17 via an insulating layer 21, and a transparent electrode 38 is formed at two sites thereabove. The n-type semiconductor layer 35 has a high-concentration layer 35A made of Al$_n$Ga$_{1-n}$N having an impurity concentration of $3\times10^{19}$/cm$^3$ at the uppermost position of the n-type semiconductor layer 35 including a region that is in contact with the transparent electrode 38.

Example 2

In the element 2B for validation shown in FIG. 3B, an n-type semiconductor layer 35 is formed above a sapphire substrate 61 via a non-doped layer 36, and a transparent electrode 38 is formed at two sites thereon. The n-type semiconductor layer 35 has a high-concentration layer 35A made of Al$_n$Ga$_{1-n}$N having an impurity concentration of $3\times10^{19}$/cm$^3$ at the uppermost position of the n-type semiconductor layer 35 including a region that is in contact with the transparent electrode 38.

The element 2B for validation is an element formed for validating whether the difference in the polarity of Al$_n$Ga$_{1-n}$N affects the ohmic connection to the transparent electrode 38.

As will be described later, in producing the LED element 1 shown in FIG. 1, first, a non-doped layer 36 is formed on a sapphire substrate 61, and thereafter an n-type semiconductor layer 35 is formed thereon. Subsequently, after a light-emitting layer 33 and a p-type semiconductor layer 31 are formed thereon, an insulating layer 21 and a conductive layer 20 including a solder layer 15 are formed. Thereafter, a separate support substrate 11 is prepared and, after a solder layer 13 is formed thereon, the sapphire substrate 61 and the support substrate 11 are bonded to each other by joining the solder layer 13 and the solder layer 15. Subsequently, while the support substrate 11 is placed on the lower side and the sapphire substrate 61 is placed on the upper side, the sapphire substrate 61 is exfoliated, and thereafter a transparent electrode 38 is formed.

$Al_nGa_{1-n}N$ has a different lattice polarity depending on whether the atoms constituting the lattice of the uppermost layer are N atoms or Ga atoms. The one in which the atoms constituting the lattice of the uppermost layer are N atoms is referred to as N polarity, and the one in which the atoms constituting the lattice of the uppermost layer are Ga atoms is referred to as Ga polarity. It is known in the art that, when $Al_nGa_{1-n}N$ is formed on a sapphire substrate 61, $Al_nGa_{1-n}N$ is formed so that Ga atoms are located in the uppermost layer of the lattice. For this reason, in the element 2B for validation shown in FIG. 3B, the crystal lattice of $Al_nGa_{1-n}N$ in the region that is in contact with the transparent electrode 38 is made of Ga atoms. In other words, the element 2B for validation is assumed to be an element in which $Al_nGa_{1-n}N$ having a Ga polarity is formed in the region that is in contact with the transparent electrode 38.

In contrast, as described above, the LED element 1 is produced by reversing the sapphire substrate 61 upward and thereafter exfoliating this sapphire substrate 61. For this reason, in the n-type semiconductor layer 35, the crystal lattice constituting the uppermost layer is made of N atoms. In other words, when the LED element 1 is produced by a production method described later, the crystal lattice of $Al_nGa_{1-n}N$ in the region that is in contact with the transparent electrode 38 is typically made of N atoms. In other words, in the region of the n-type semiconductor layer 35 that is in contact with the transparent electrode 38, $Al_nGa_{1-n}N$ having an N polarity is formed. In view of this, the element 2A for validation is assumed to be an element in which $Al_nGa_{1-n}N$ having an N polarity is formed in the region that is in contact with the transparent electrode 38. However, depending on the production method, there may be a case in which $Al_nGa_{1-n}N$ having a Ga polarity is formed in the region that is in contact with the transparent electrode 38, so that the experiments were carried out also on the element 2B for validation of Example 2.

Comparative Example

The element 2C for validation shown in FIG. 3C is constructed in such a manner that an n-type semiconductor layer 95 made of GaN is formed instead of the n-type semiconductor layer 35 made of $Al_nGa_{1-n}N$ with respect to the element 2B for validation. This n-type semiconductor layer 95 has a layer 95A made of GaN having an impurity concentration of $1\times10^{19}/cm^3$ (upper limit value at which the film roughening is not generated) at the uppermost position of the n-type semiconductor layer 95 including the region that is in contact with the transparent electrode 38. Here, in the case of this construction, the lattice polarity of GaN formed in the region that is in contact with the transparent electrode 38 is an N polarity similarly to Example 2.

Figure 4A:
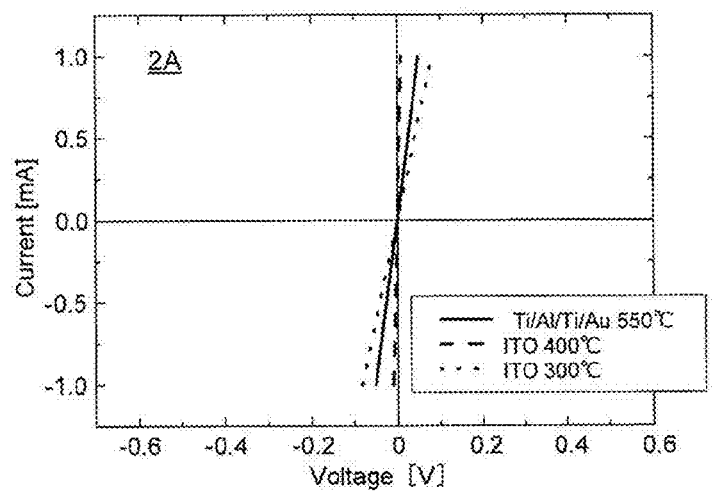
FIG. 4A is a graph showing I-V characteristics in Example 1.
Figure 4B:
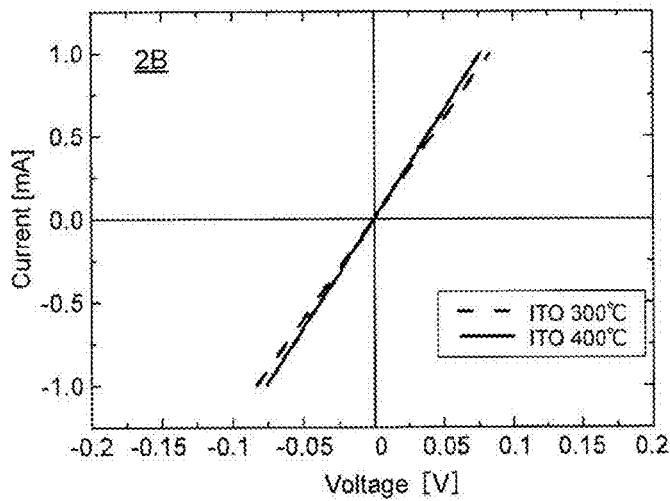
FIG. 4B is a graph showing I-V characteristics in Example 2.
Figure 4C:
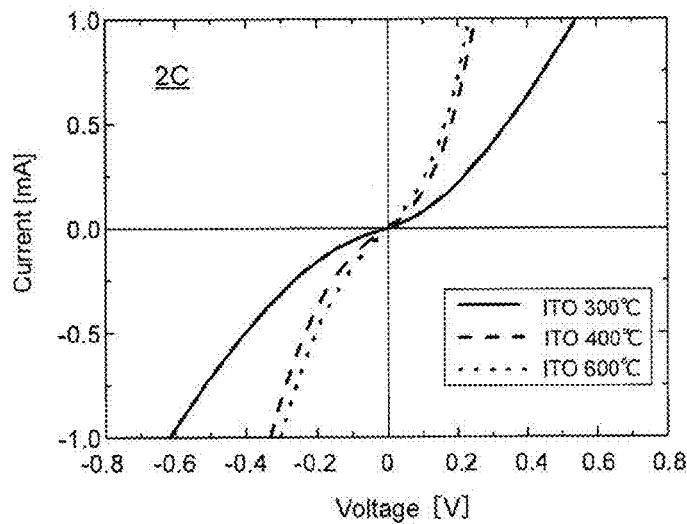
FIG. 4C is a graph showing I-V characteristics in Comparative Example.

FIGS. 4A to 4C show graphs obtained by measuring the I-V characteristics between the n-type semiconductor layer and the transparent electrode 38 formed thereabove with respect to each of the elements 2A, 2B, and 2C for validation. Specifically, a voltage V is applied between the two transparent electrodes 38 formed to be spaced apart from each other, and the relationship between the value of this V and the amount I of the current flowing via the high-concentration n-type semiconductor layer (35A, 95A) is made into a graph. In a further more detail, this graph is made in such a manner that a current I is measured for each applied voltage while gradually changing the voltage applied between the two from 0 to a negative voltage or from 0 to a positive voltage with 0 V used as a standard, and the relationship between the applied voltage and the current is made into a graph.

FIG. 4A corresponds to the element 2A for validation (Example 1); FIG. 4B corresponds to the element 2B for validation (Example 2); and FIG. 4C corresponds to the element 2C for validation (Comparative Example). Here, in FIG. 4A, as a comparison for confirming the formation of ohmic connection, the I-V characteristics of the case in which an ordinary metal electrode material (Ti/Al/Ti/Au) is formed instead of the transparent electrode 38 are also depicted together.

According to FIG. 4A, it will be understood that, when the n-type semiconductor layer 35 in the region that is in contact with the transparent electrode 38 is made of $Al_nGa_{1-n}N$ of an N polarity having an impurity concentration of $3\times10^{19}/cm^3$, almost linear I-V characteristics are exhibited even when the transparent electrode 38 made of ITO is formed thereon, in the same manner as in the case in which the metal electrode (Ti/Al/Ti/Au) is formed. Also, little change is seen in the characteristics thereof in the case in which the temperature of annealing ITO is 300° C. and in the case in which the temperature of annealing ITO is 400° C. In other words, it will be understood that, by constructing the region that is in contact with the transparent electrode 38 with $Al_nGa_{1-n}N$ having an impurity concentration of $3\times10^{19}/cm^3$, an ohmic connection similar to the case in which a metal electrode is formed on is achieved.

Also, according to FIG. 4B, it will be understood that, when the n-type semiconductor layer 35 in the region that is in contact with the transparent electrode 38 is made of $Al_nGa_{1-n}N$ of a Ga polarity having an impurity concentration of $3\times10^{19}/cm^3$, an ohmic connection is achieved even when the transparent electrode 38 is formed thereon, in the same manner as in FIG. 4A. From FIGS. 4A and 4B, it will be understood that the I-V characteristics between the transparent electrode 38 and the n-type semiconductor layer 35 do not depend on the polarity of the n-type semiconductor layer 35 in the region that is in contact with the transparent electrode 38.

In contrast, when the n-type semiconductor layer 35 in the region that is in contact with the transparent electrode 38 is made of GaN having an impurity concentration of $1\times10^{19}/cm^3$ as shown in FIG. 4C, the gradient of the I-V characteristics curve in a region close to 0 V is more moderate than the gradient of the I-V characteristics curve in negative-voltage and positive-voltage regions distant from 0 V. This shows that the current is more likely to flow when a voltage having a large absolute value is applied, and the current is less likely to flow when a voltage having a small absolute value close to 0 V is applied, thereby suggesting that a Schottky connection is formed.

By raising the temperature of annealing ITO, the carrier concentration of ITO can be increased. However, according to FIG. 4C, the Schottky connection is still formed even when the temperature of annealing ITO is raised to 600° C., thereby failing to achieve an ohmic connection. Here, as will be described in detail later, in achieving the LED element 1, there is a need to perform a step of bonding the two substrates with each other with use of a solder layer. If the annealing of ITO is carried out at a temperature exceeding the melting point of the solder, the solder is melted, and a positional shift of the bonded substrates from each other occurs, thereby raising a fear that the melted metal adheres to the side wall to deteriorate the electric characteristics. For this reason, the annealing of ITO cannot be carried out at a temperature exceeding the melting point of the solder.

In view of the above, according to FIG. 4C, it can be concluded that, when the n-type semiconductor layer 35 in the region that is in contact with the transparent electrode 38 is made of GaN having an impurity concentration of $1\times10^{19}/cm^3$, an ohmic connection between the n-type semiconductor layer 35 and the transparent electrode 38 cannot be achieved.

Here, although the I-V characteristics in the case in which the n-type semiconductor layer 35 is made of GaN having a Ga polarity are not shown, a feature similar to that of FIG. 4C was obtained. As described above with reference to FIGS. 4A and 4B, it will be understood that the I-V characteristics between the transparent electrode 38 and the n-type semiconductor layer 35 do not depend on the polarity of the n-type semiconductor layer 35 in the region that is in contact with the transparent electrode 38.

In other words, it will be understood that, when the material constituting the n-type semiconductor layer 35 is GaN, an ohmic connection between the n-type semiconductor layer 35 and the transparent electrode 38 is not achieved even when the impurity concentration is set to be $1\times10^{19}/cm^3$ which is the maximum impurity concentration within a range in which the problem of film roughening is not caused. In this case, the resistance value between the transparent electrode 38 and the n-type semiconductor layer 35 increases, whereby the voltage needed to allow the current needed for light emission to flow increases.

By using $Al_nGa_{1-n}N$ as the n-type semiconductor layer 35 as in the LED element 1, a high-concentration layer 35A exceeding $1\times10^{19}/cm^3$ can be achieved without generating the film roughening. Further, by bringing such a high-concentration layer 35A and the transparent electrode 38 into contact with each other, an ohmic connection between the n-type semiconductor layer 35 and the transparent electrode 38 is achieved. Therefore, a sufficient current can be let to flow through the light-emitting layer with a low applied voltage even when the transparent electrode 38 is formed as the n-side electrode on the whole surface of the n-type semiconductor layer 35.

[Validation of Light Permeability]

Figure 5A:
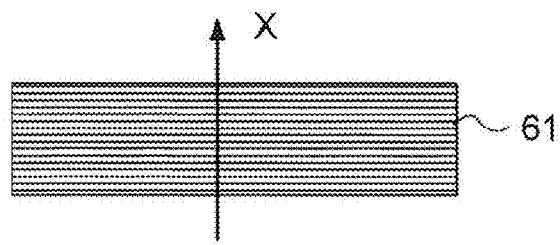
FIG. 5A is a construction view of an element for validation for evaluating the light permeability of a transparent electrode.
Figure 5B:
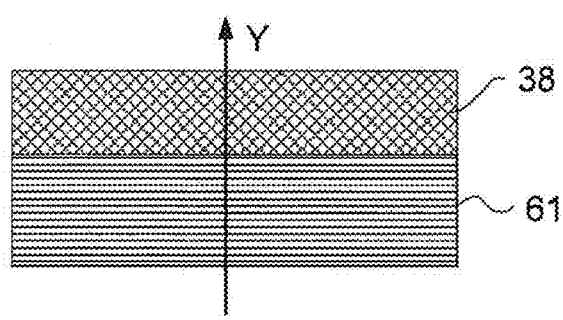
FIG. 5B is a construction view of an element for validation for evaluating the light permeability of a transparent electrode.

Next, the light permeability of the transparent electrode 38 will be validated. FIGS. 5A and 5B are conceptual views for describing a validation method, and FIG. 5C is a graph showing a validation result.

Referring to FIG. 5A, light is radiated from the back surface of the sapphire substrate 61, and light quantity X at the front surface is measured. Similarly, referring to FIG. 5B, with respect to an element in which the transparent electrode 38 is formed on the sapphire substrate 61, light is radiated from the back surface of the sapphire substrate 61, and light quantity Y at the front surface (transparent electrode 38 side) is measured. Measurement as described above is carried out while changing the wavelength of the light, and the permeability d=Y/X is calculated for each wavelength and made into a graph, which is shown in FIG. 5C. Here, the method of measuring the light quantity was carried out using an ultraviolet-visible light spectrophotometer.

Figure 5C:
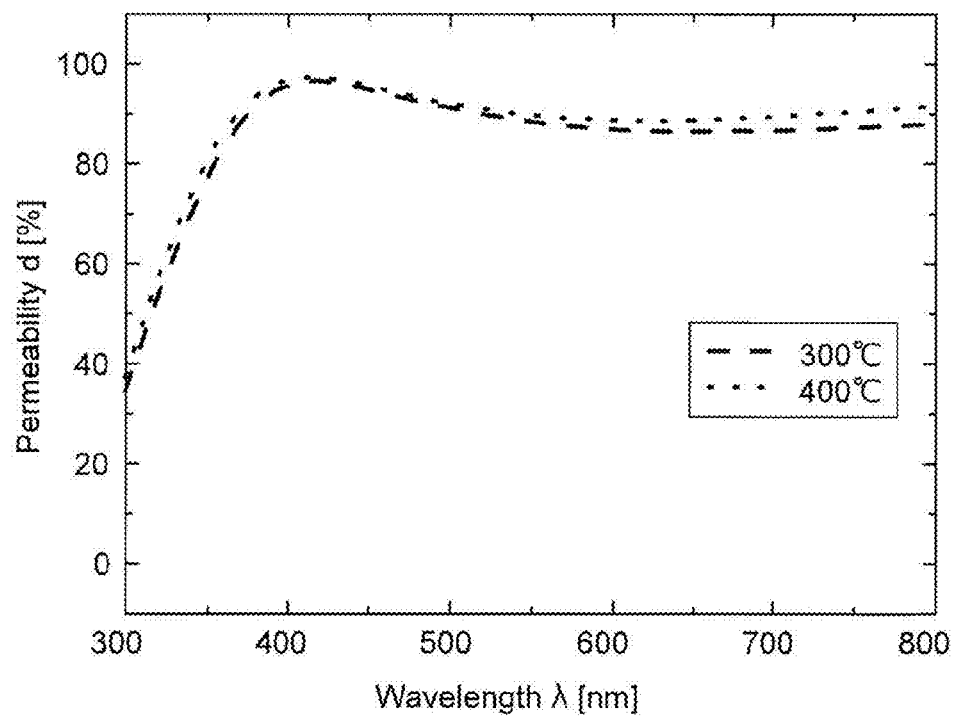
FIG. 5C is a graph showing the light permeability of a transparent electrode.

According to FIG. 5C, within a range of $\lambda \geq 400$ nm, a permeability d of 90% or more is achieved irrespective of whether the temperature of annealing ITO is 300° C. or 400° C. Also, within a range of $\lambda \geq 350$ nm, a permeability d of 80% or more is achieved. Therefore, it will be understood that the transparent electrode 38 sufficiently has a function of permeating light. In other words, referring to FIG. 1, even when the transparent electrode 38 is formed on the whole surface of the LED layer 30 in the LED element 1, the light emitted in the LED layer 30 is not greatly damped by the transparent electrode 38, and the light can be extracted to the outside at a high efficiency.

[Temperature of Annealing ITO]

Figure 6:
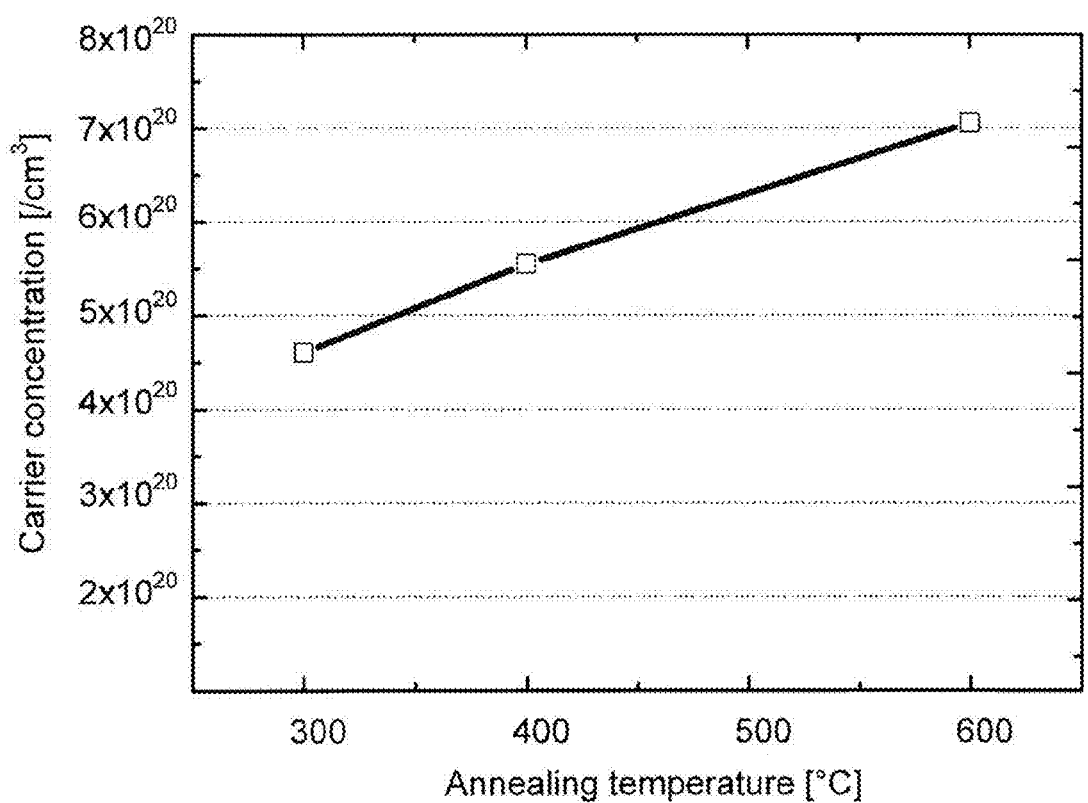
FIG. 6 is a graph showing a relationship between the temperature of annealing ITO and a carrier concentration.

FIG. 6 is a graph showing a relationship between the temperature of annealing ITO and the carrier concentration within ITO.

Even when the impurity concentration of the n-type semiconductor layer 35 is increased to be sufficiently high, the resistance value between the n-type semiconductor layer 35 and the transparent electrode 38 cannot be reduced when the carrier concentration of the material constituting the transparent electrode 38 is considerably low. According to FIG. 6, in the case in which ITO is used as the transparent electrode 38, a carrier concentration of $4.5\times10^{20}/cm^3$ in ITO is achieved when the temperature of annealing ITO is set to be 300° C. When a sufficiently high ITO carrier concentration is achieved in this manner, the resistance value between the n-type semiconductor layer 35 and the transparent electrode (ITO) 38 is dependent on the impurity concentration of the n-type semiconductor layer 35 rather than on the carrier concentration of ITO.

According to FIG. 6, it will be understood that a sufficient carrier concentration is ensured in ITO when the transparent electrode 38 is made of ITO. Referring to FIGS. 4A and 4B, this is another ground showing that an ohmic connection is achieved between the n-type semiconductor layer 35 and the transparent electrode 38.

[Method for Producing LED Element 1]

Next, a method for producing the LED element 1 of the present invention will be described with reference to the process sectional views shown in FIGS. 7A to 7H and the flowchart shown in FIG. 8. Also, the step number shown in the following description corresponds to the step number in the flowchart of FIG. 8.

Also, the production conditions, the dimensions such as the film thickness, and the like described in the following production method are merely examples, and the present invention is not limited to these numerical values alone.

(Step S1)

Figure 7A:
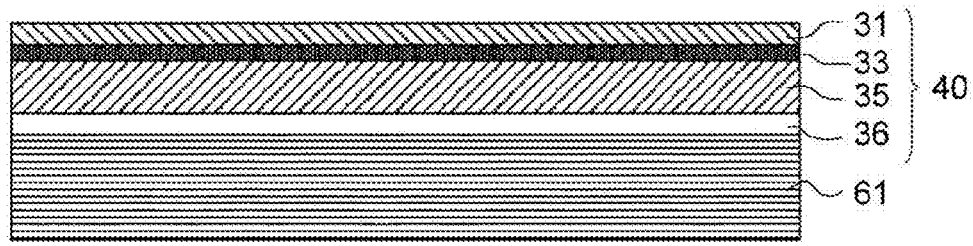
FIG. 7A is a part of a process sectional view of an LED element.
Figure 8:
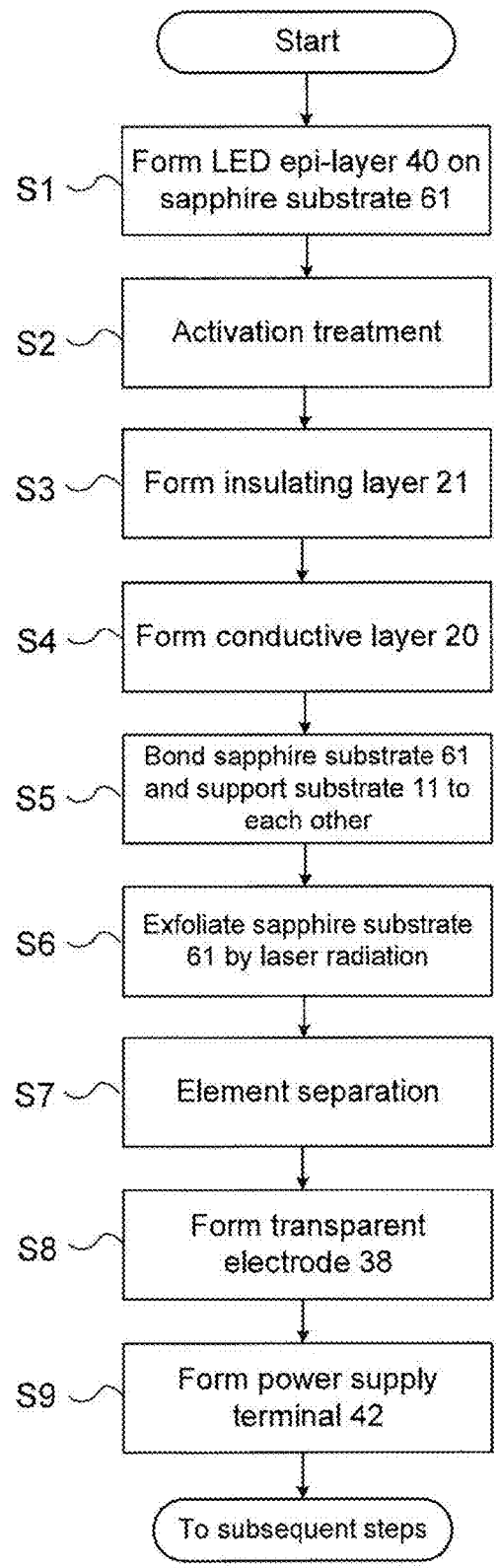
FIG. 8 is a flowchart showing a method for producing an LED element.

Referring to FIG. 7A, an LED epi-layer 40 is formed on a sapphire substrate 61. This step S1 corresponds to the steps (a) to (c) and is carried out, for example, according to the following procedure.

<Preparation of Sapphire Substrate 61>

First, a c-plane sapphire substrate 61 is cleaned. More specifically, this cleaning is carried out, for example, by placing the c-plane sapphire substrate 61 in a treatment furnace of an MOCVD (Metal Organic Chemical Vapor Deposition) apparatus and raising the temperature within the furnace to, for example, 1150° C. while allowing a hydrogen gas having a flow rate of 10 slm to flow within the treatment furnace. This step of preparing the sapphire substrate 61 corresponds to the step (a).

<Formation of Non-Doped Layer 36>

Next, on a front surface of the c-plane sapphire substrate 61, a low-temperature buffer layer made of GaN is formed, and further a foundation layer made of GaN is formed thereon. These low-temperature buffer layer and foundation layer correspond to the non-doped layer 36.

A more specific method for forming the non-doped layer 36 is, for example, as follows. First, the pressure within the furnace of the MOCVD apparatus is set to be 100 kPa, and the temperature within the furnace is set to be 480° C. Then, while allowing a nitrogen gas and a hydrogen gas each having a flow rate of 5 slm to flow as a carrier gas within the treatment furnace, trimethylgallium having a flow rate of 50 μmol/min and ammonia having a flow rate of 250000 µmol/min are supplied for 68 seconds as a source material gas into the treatment furnace. This allows that a low-temperature buffer layer made of GaN having a thickness of 20 nm is formed on the front surface 61 of the c-plane sapphire substrate.

Next, the temperature within the furnace of the MOCVD apparatus is raised to 1150° C. Then, while allowing a nitrogen gas having a flow rate of 20 slm and a hydrogen gas having a flow rate of 15 slm to flow as a carrier gas within the treatment furnace, trimethylgallium having a flow rate of 100 µmol/min and ammonia having a flow rate of 250000 µmol/min are supplied for 30 minutes as a source material gas into the treatment furnace. This allows that a foundation layer made of GaN having a thickness of 1.7 µm is formed on the front surface of the first buffer layer.

<Formation of n-Type Semiconductor Layer 35>

Next, an electron supply layer having a composition of $Al_nGa_{1-n}N$ (0<n<1) is formed on the non-doped layer 36, and further a protective layer made of n-type GaN is formed thereon. These electron supply layer and protective layer correspond to the n-type semiconductor layer 35.

A more specific method for forming the n-type semiconductor layer 35 is, for example, as follows. First, the pressure within the furnace of the MOCVD apparatus is set to be 30 kPa. Then, while allowing a nitrogen gas having a flow rate of 20 slm and a hydrogen gas having a flow rate of 15 slm to flow as a carrier gas within the treatment furnace, trimethylgallium having a flow rate of 94 µmol/min, trimethylaluminum having a flow rate of 6 µmol/min, ammonia having a flow rate of 250000 µmol/min, and tetraethylsilane having a flow rate of 0.025 µmol/min are supplied for 30 minutes as a source material gas into the treatment furnace. This allows that a high-concentration electron supply layer having a composition of $Al_{0.06}Ga_{0.94}N$, having an Si concentration of $3 \times 10^{19}/cm^3$, and having a thickness of 1.7 µm is formed on the upper layer of the non-doped layer 36.

Thereafter, supply of trimethylaluminum is stopped, and the source material gas other than that is supplied for 6 seconds, thereby to form a protective layer made of n-type GaN having a thickness of 5 nm on the upper layer of the electron supply layer.

Here, as the n-type impurity contained in the n-type semiconductor layer 35, silicon (Si), germanium (Ge), sulfur (S), selenium (Se), tin (Sn), tellurium (Te), and the like can be used. Among these, silicon (Si) is particularly preferable.

This step of forming the n-type semiconductor layer 35 corresponds to the step (b).

<Formation of Light-Emitting Layer 33>

Next, a light-emitting layer 33 having a multiquantum well structure in which a well layer made of GaInN and a barrier layer made of n-type AlGaN are periodically repeated is formed on the upper layer of the n-type semiconductor layer 35.

A more specific method for forming the light-emitting layer 33 is, for example, as follows. First, the pressure within the furnace of the MOCVD apparatus is set to be 100 kPa, and the temperature within the furnace is set to be 830° C. Then, while allowing a nitrogen gas having a flow rate of 15 slm and a hydrogen gas having a flow rate of 1 slm to flow as a carrier gas within the treatment furnace, a step of supplying trimethylgallium having a flow rate of 10 µmol/min, trimethylindium having a flow rate of 12 µmol/min, and ammonia having a flow rate of 300000 µmol/min for 48 seconds as a source material gas into the treatment furnace is carried out. Thereafter, a step of supplying trimethylgallium having a flow rate of 10 µmol/min, trimethylaluminum having a flow rate of 1.6 µmol/min, tetraethylsilane having a flow rate of 0.002 µmol/min, and ammonia having a flow rate of 300000 µmol/min for 120 seconds into the treatment furnace is carried out. Subsequently, by repeating these two steps, a light-emitting layer 33 having a multiquantum well structure with 15 periods constructed by a well layer made of GaInN having a thickness of 2 nm and a barrier layer made of n-type AlGaN having a thickness of 7 nm is formed on the front surface of the n-type semiconductor layer 35.

<Formation of p-Type Semiconductor Layer 31>

Next, a layer (hole supply layer) made of $Al_mGa_{1-m}N$ (0<m<1) is formed on the upper layer of the light-emitting layer 33, and further a layer (protective layer) made of p-type GaN is formed thereon. These hole supply layer and protective layer correspond to the p-type semiconductor layer 31.

A more specific method for forming the p-type semiconductor layer 31 is, for example, as follows. First, the pressure within the furnace of the MOCVD apparatus is maintained to be 100 kPa and, while allowing a nitrogen gas having a flow rate of 15 slm and a hydrogen gas having a flow rate of 25 slm to flow as a carrier gas within the treatment furnace, the temperature within the furnace is raised to 1050° C. Thereafter, trimethylgallium having a flow rate of 35 µmol/min, trimethylaluminum having a flow rate of 20 µmol/min, ammonia having a flow rate of 250000 µmol/min, and bis(cyclopentadienyl)magnesium having a flow rate of 0.1 µmol/min are supplied for 60 seconds as a source material gas into the treatment furnace. This allows that a hole supply layer having a composition of $Al_{0.3}Ga_{0.7}N$ and having a thickness of 20 nm is formed on the front surface of the light-emitting layer 33. Thereafter, by supplying the source material gas for 360 seconds after changing the flow rate of trimethylaluminum to 9 µmol/min, a hole supply layer having a composition of $Al_{0.13}Ga_{0.87}N$ and having a thickness of 120 nm is formed.

Further thereafter, supply of trimethylaluminum is stopped and, by supplying the source material gas for 20 seconds after changing the flow rate of bis(cyclopentadienyl)magnesium to 0.2 µmol/min, a contact layer made of p-type GaN having a thickness of 5 nm is formed.

Here, as the p-type impurity, magnesium (Mg), beryllium (Be), zinc (Zn), carbon (C), and the like can be used.

Here, the step of forming the light-emitting layer 33 and the p-type semiconductor layer 31 corresponds to the step (c).

In this manner, the LED epi-layer 40 made of the non-doped layer 36, the n-type semiconductor layer 35, the light-emitting layer 33, and the p-type semiconductor layer 31 is formed on the sapphire substrate 61.

(Step S2)

Next, an activation treatment is carried out on the wafer obtained in the step S1. More specifically, an activation treatment at 650° C. for 15 minutes is carried out in a nitrogen atmosphere using an RTA (Rapid Thermal Anneal) apparatus.

(Step S3)

Figure 7B:
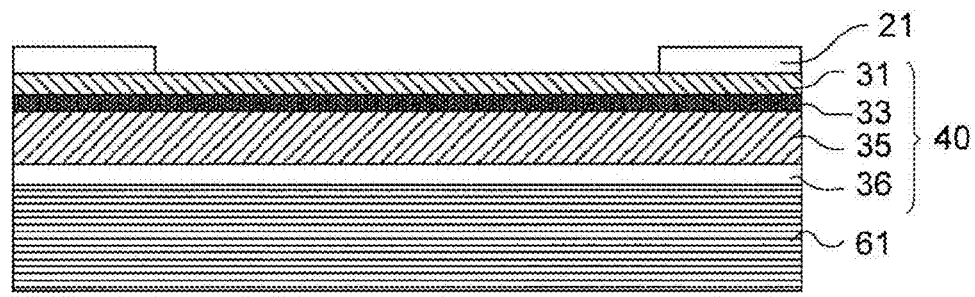
FIG. 7B is a part of a process sectional view of an LED element.

Next, referring to FIG. 7B, an insulating layer 21 is formed at predetermined sites on the upper layer of the p-type semiconductor layer 31. More specifically, the insulating layer 21 is formed at the sites located below the region where the power supply terminals 42 will be formed in a later step. As the insulating layer 21, a film of $SiO_2$, for example, is formed in a thickness of about 200 nm. Here, it is sufficient that the material used for forming the film is an insulating material, and the material may be, for example, SiN, $Al_2O_3$, or the like.

This step S3 corresponds to the step (d).

(Step S4)

Figure 7C:
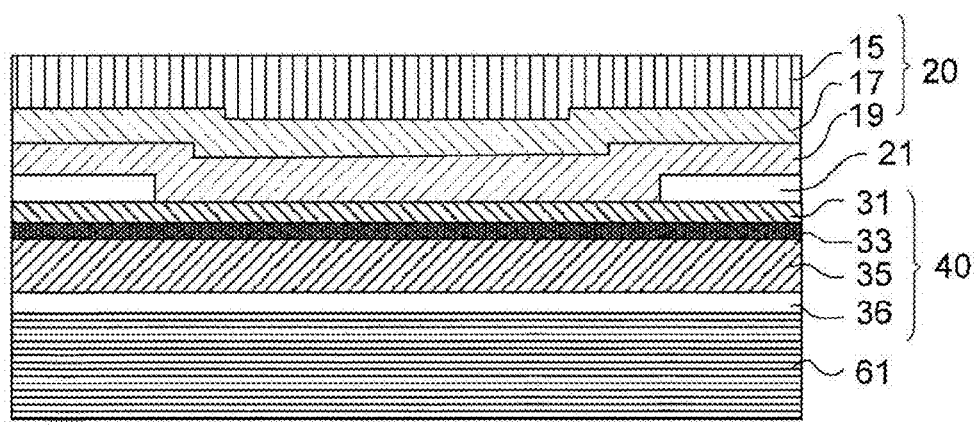
FIG. 7C is a part of a process sectional view of an LED element.

Referring to FIG. 7C, a conductive layer 20 is formed to cover the upper surface of the p-type semiconductor layer 31 and the insulating layer 21. In the present embodiment, the conductive layer 20 having a multilayer structure including a reflective electrode 19, a protective layer 17, and a solder layer 15 is formed.

A more specific method for forming the conductive layer 20 is, for example, as follows. First, a film of Ni having a thickness of 0.7 nm and a film of Ag having a thickness of 120 nm are formed over the whole surface so as to cover the upper surface of the p-type semiconductor layer 31 and the insulating layer 21 by using a sputtering apparatus, thereby to form the reflective electrode 19. Next, contact annealing at 400° C. for 2 minutes is carried out in a dry air atmosphere using an RTA apparatus.

Next, a film of Ti having a thickness of 100 nm and a film of Pt having a thickness of 200 nm are formed for 3 periods on the upper surface (Ag surface) of the reflective electrode 19 using an electron beam vapor deposition apparatus (EB apparatus), thereby to form the protective layer 17. Further thereafter, Ti having a thickness of 10 nm is vapor-deposited on the upper surface (Pt surface) of the protective layer 17, and thereafter Au—Sn solder made of 80% of Au and 20% of Sn is vapor-deposited in a thickness of 3 μm, thereby to form the solder layer 15.

Figure 7D:
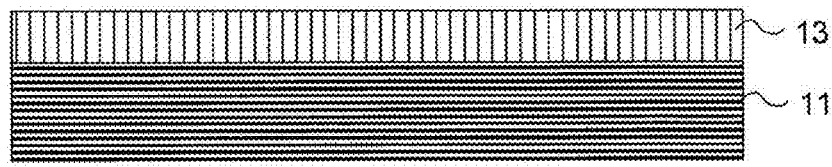
FIG. 7D is a part of a process sectional view of an LED element.

Here, in this step of forming the solder layer 15, a solder layer 13 may be formed on an upper surface of a support substrate 11 that is prepared separately from the sapphire substrate 61 (See FIG. 7D). This solder layer 13 may be made of the same material as the solder layer 15. By joining the solder layer 15 and the solder layer 13 with each other in the next step, the sapphire substrate 61 and the support substrate 11 are bonded to each other. Here, as described above in the section of structure, CuW, for example, is used as this support substrate 11.

This step S4 corresponds to the step (e).

(Step S5)

Figure 7E:
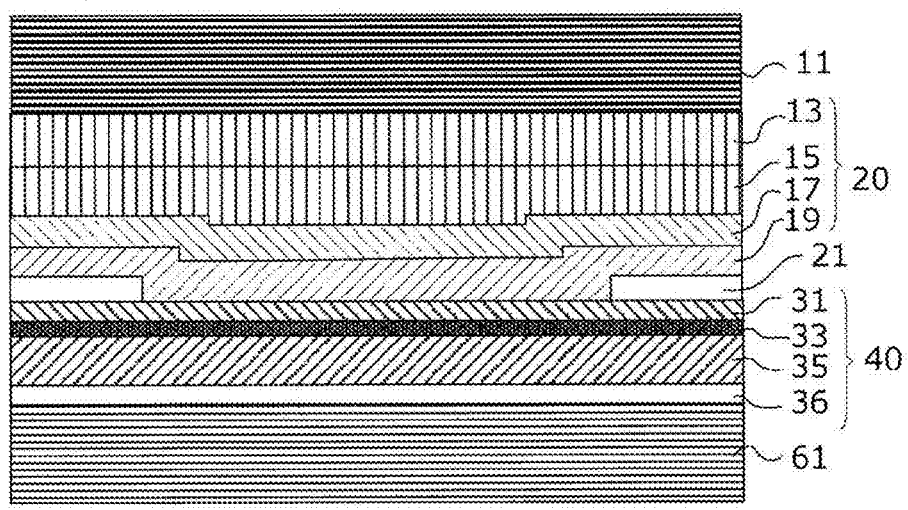
FIG. 7E is a part of a process sectional view of an LED element.

Next, referring to FIG. 7E, the sapphire substrate 61 and the support substrate 11 are bonded to each other. More specifically, the solder layer 15 and the solder layer 13 formed on the upper layer of the support substrate 11 are bonded to each other at a temperature of 280° C. and under a pressure of 0.2 MPa. This step S5 corresponds to the step (f).

(Step S6)

Figure 7F:
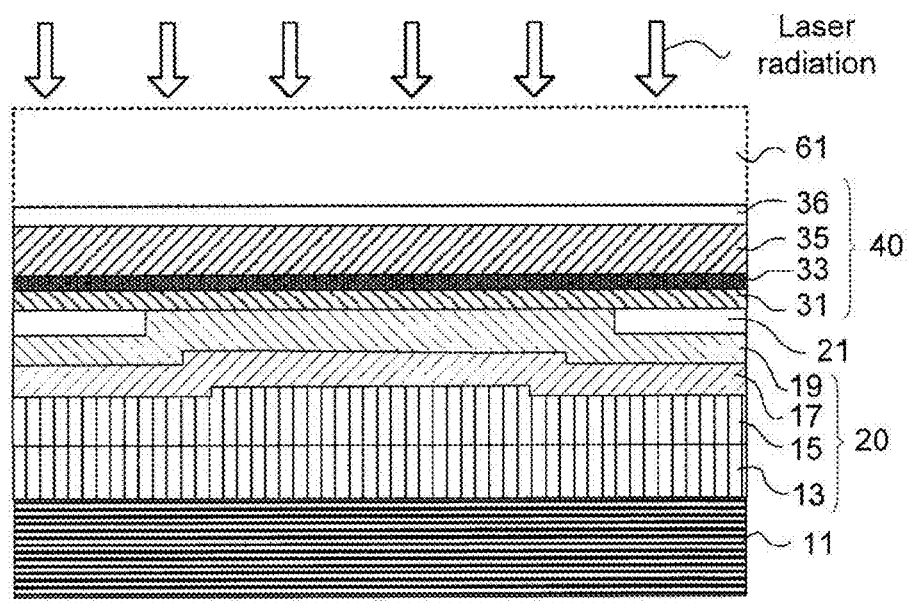
FIG. 7F is a part of a process sectional view of an LED element.

Next, referring to FIG. 7F, the sapphire substrate 61 is exfoliated. More specifically, KrF excimer laser is radiated from the sapphire substrate 61 side in a state in which the sapphire substrate 61 is facing upward and the support substrate 11 is facing downward, so as to exfoliate the sapphire substrate 61 by thermally decomposing the interface between the sapphire substrate 61 and the LED epi-layer 40. While laser passes through the sapphire substrate 61, GaN (non-doped layer 36) located therebelow absorbs laser, so that this interface comes to have a high temperature to decompose GaN. This exfoliates the sapphire substrate 61.

Thereafter, GaN (non-doped layer 36) remaining on the wafer is removed by wet etching using hydrochloric acid or the like or by dry etching using an ICP apparatus to expose the n-type semiconductor layer 35. Here, in the present step S6, the non-doped layer 36 is removed to leave the LED layer 30 in which the p-type semiconductor layer 31, the light-emitting layer 33, and the n-type semiconductor layer 35 are laminated in this order.

This step S6 corresponds to the step (g).

(Step S7)

Figure 7G:
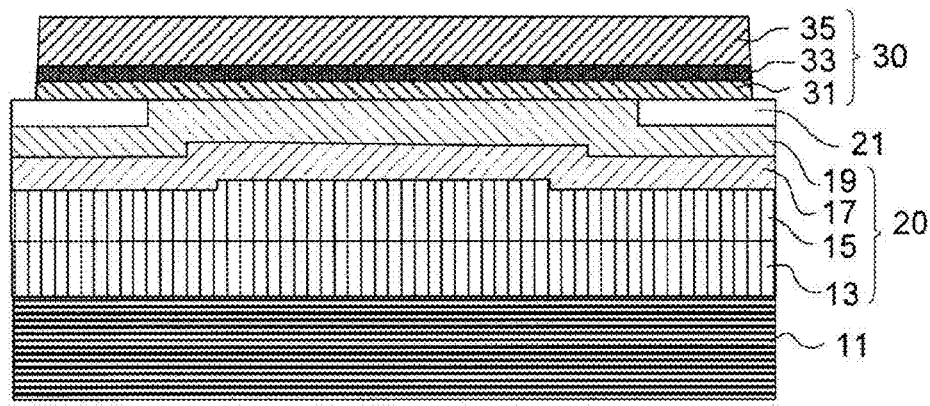
FIG. 7G is a part of a process sectional view of an LED element.

Next, referring to FIG. 7G, adjacent elements are separated from each other. More specifically, with respect to a boundary region to an adjacent element, the LED layer 30 is etched using an ICP apparatus until the upper surface of the insulating layer 21 is exposed. This separates the LED layers 30 of adjacent regions from each other. Here, during this time, the insulating layer 21 functions as a etching stopper layer.

Here, in this etching step, it is preferable that the element side surface is made to be an inclined surface having a taper angle of 10° or more instead of being vertical. This allows that an insulating layer is more likely to adhere to the side surface of the LED layer 30 when the insulating layer is formed in a later step, whereby current leakage can be prevented.

Also, after the step S7, an uneven undulating surface may be formed on the upper surface of the LED layer 30 by using an alkali solution such as KOH. This increases the light extraction area and can improve the light extraction efficiency.

(Step S8)

Figure 7H:
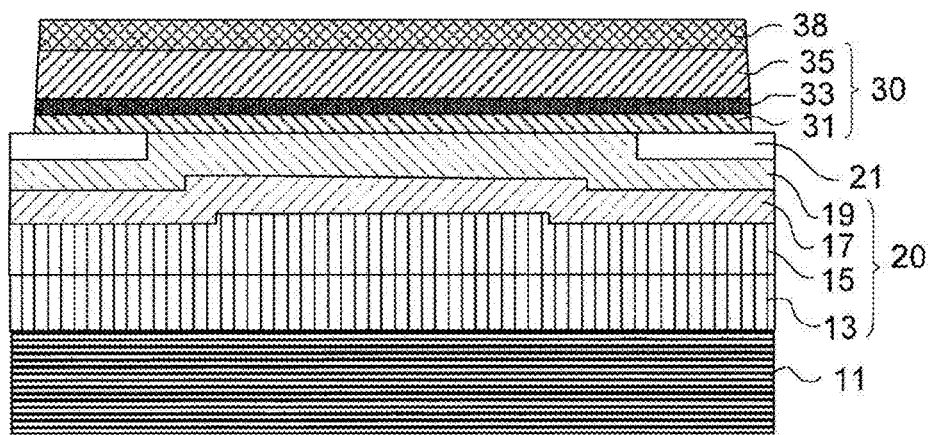
FIG. 7H is a part of a process sectional view of an LED element.

Next, referring to FIG. 7H, a transparent electrode 38 is formed on the whole surface of the n-type semiconductor layer 35. More specifically, a film of a conductive light-permeable material such as ITO or IZO is formed in a thickness of 30 nm to 600 nm by the sputtering method. The film thickness is more preferably set to be 100 to 300 nm.

Thereafter, in order to promote recrystallization of the light-permeable material formed into a film, an activation treatment (contact annealing) is carried out at 600° C. for 5 minutes in a nitrogen atmosphere using an RTA apparatus.

This step S8 corresponds to the step (h).

(Step S9)

Next, a power supply terminal 42 is formed on the upper surface of the transparent electrode 38 (See FIG. 1). More specifically, after forming the power supply terminal 42 made of Cr having a film thickness of 100 nm and Au having a film thickness of 3 μm, sintering is carried out at 250° C. for 1 minute in a nitrogen atmosphere. This step S9 corresponds to the step (i).

As subsequent steps, the exposed element side surface and the element upper surface excluding the power supply terminal 42 are covered with an insulating layer. More specifically, an $SiO_2$ film is formed using an EB apparatus. Here, an SiN film may be formed as well. Further, the elements are separated from each other using, for example, a laser dicing apparatus; the back surface of the support substrate 11 is joined to a package using, for example, an Ag paste; and wire bonding is carried out onto the power supply terminal 42.

Other Embodiments

Hereafter, other embodiments will be described.

<1> In the above-described embodiment, the protective layer 17 is formed on the sapphire substrate 61 side; however, the protective layer 17 may be formed on the support substrate 11 side as well. In other words, instead of the construction shown in FIG. 7D, the one in which the protective layer 17 is formed on the upper layer of the support substrate 11 and the solder layer 13 is formed thereon may be bonded to the sapphire substrate 61 in the step S8.

<2> In the above-described embodiment, solder layers are formed both on the sapphire substrate 61 and on the support substrate 11 (solder layers 13, 15); however, the two substrates may be bonded to each other after a solder layer is formed on only one of the two substrates.

<3> The structure shown in FIG. 1 and the production method shown in FIGS. 7A to 7H and FIG. 8 are examples of preferable embodiments, so that there is no need to provide all of these constructions and processes. For example, the solder layer 13 and the solder layer 15 are formed for efficiently performing the bonding of two substrates, so that the solder layer 13 and the solder layer 15 are not necessarily needed in achieving the function of the LED element 1 as long as the bonding of the two substrates can be achieved.

The reflective electrode 19 is preferably provided from the viewpoint of further improving the extraction efficiency of the light radiated from the light-emitting layer 33; however, there is not necessarily a need to provide the reflective electrode 19. The same applies to the protective layer 17, the uneven undulation on the front surface of the n-type semiconductor layer 35, and the like as well.

Also, the insulating layer 21 is formed to function as an etching stopper layer at the time of element separation; however, there is not necessarily a need to provide the insulating layer 21. The LED element 1 has a construction in which the transparent electrode 38 is formed above and over the whole surface of the n-type semiconductor layer 35. Therefore, there is not necessarily a need to provide the insulating layer 21 vertically under the power supply terminal 42 for the purpose of horizontally widening the current flowing within the light-emitting layer 33.

DESCRIPTION OF REFERENCE SIGNS

1: LED element
2A, 2B, 2C: element for validation
11: support substrate
13: solder layer
15: solder layer
17: protective layer
19: reflective electrode
20: conductive layer
21: insulating layer
30: LED layer
31: p-type semiconductor layer
33: light-emitting layer
35: n-type semiconductor layer
35A: n-type high-concentration layer
36: non-doped layer
38: transparent electrode
40: LED epi-layer
42: power supply terminal
61: sapphire substrate
95: n-type semiconductor layer (GaN)
95A: high-concentration region of n-type GaN

The invention claimed is:

1. An LED element comprising:
a support substrate made of a conductor or a semiconductor;
a conductive layer formed on an upper layer of the support substrate;
an insulating layer formed so that a bottom surface thereof is in contact with a portion of an upper surface of the conductive layer;
a first semiconductor layer made of a p-type nitride semiconductor formed so that a bottom surface thereof is in contact with a portion of the upper surface of the conductive layer and a portion of an upper surface of the insulating layer;
a light-emitting layer made of a nitride semiconductor formed on an upper layer of the first semiconductor layer;
a second semiconductor layer made of an n-type nitride semiconductor formed on the upper layer of the light-emitting layer;
a transparent electrode formed on an entire upper surface of the second semiconductor layer; and
a power supply terminal formed so that a bottom surface thereof is in contact with a portion of an upper surface of the transparent electrode, wherein
the second semiconductor layer in at least a region that is in contact with the transparent electrode is made of $Al_nGa_{1-n}N$ ($0<n<1$) and has an n-type impurity concentration larger than $1\times10^{19}/cm^3$.

* * * * *